(12) United States Patent
Nguyen et al.

(10) Patent No.: US 12,225,679 B2
(45) Date of Patent: Feb. 11, 2025

(54) ELECTRONIC ASSEMBLY HAVING SEALING RETAINER COUPLING AN ELECTRONIC MODULE AND ASSOCIATED METHOD

(71) Applicant: EAGLE TECHNOLOGY, LLC, Melbourne, FL (US)

(72) Inventors: Voi Nguyen, Oviedo, FL (US); Jason Thompson, Melbourne, FL (US); Charles Weirick, Melbourne, FL (US)

(73) Assignee: EAGLE TECHNOLOGY, LLC, Melbourne, FL (US)

( * ) Notice: Subject to any disclaimer, the term of this patent is extended or adjusted under 35 U.S.C. 154(b) by 348 days.

(21) Appl. No.: 17/662,235

(22) Filed: May 6, 2022

(65) Prior Publication Data

US 2023/0363103 A1 Nov. 9, 2023

(51) Int. Cl.
*H05K 7/20* (2006.01)
*H05K 7/14* (2006.01)

(52) U.S. Cl.
CPC ....... *H05K 7/20145* (2013.01); *H05K 7/1422* (2013.01); *H05K 7/20727* (2013.01)

(58) Field of Classification Search
CPC ............. H05K 7/20145; H05K 7/1422; H05K 7/20727; H05K 7/20563
See application file for complete search history.

(56) References Cited

U.S. PATENT DOCUMENTS

| 3,956,673 | A | | 5/1976 | Seid |
|---|---|---|---|---|
| 4,277,815 | A | | 7/1981 | Skroupa |
| 4,375,290 | A | * | 3/1983 | Zucchi ............... H05K 7/1418 |
| | | | | 361/796 |
| 4,442,475 | A | | 4/1984 | Franklin et al. |
| 4,672,509 | A | | 6/1987 | Speraw |
| 4,829,402 | A | | 5/1989 | Gewebler et al. |
| 5,034,852 | A | | 7/1991 | Rosenberg |
| 5,220,485 | A | | 6/1993 | Chakrabarti |
| 5,253,963 | A | | 10/1993 | Ries |
| 5,407,297 | A | | 4/1995 | Hulme et al. |
| 5,607,273 | A | | 3/1997 | Kecmer et al. |

(Continued)

FOREIGN PATENT DOCUMENTS

| CA | 2657056 | 9/2009 |
|---|---|---|
| EP | 2106205 A2 | 9/2009 |

(Continued)

*Primary Examiner* — Anthony M Haughton
*Assistant Examiner* — Theron S Milliser
(74) *Attorney, Agent, or Firm* — ALLEN, DYER, DOPPELT, +GILCHRIST, P.A.

(57) ABSTRACT

An electronic assembly includes a chassis having electronic module mounting positions, each having an electronic module received therein. A module recess is adjacent a first end of the electronic module and a module roller is adjacent a second end. A sealing retainer is coupled between the chassis and each electronic module, and includes a cooling gas passageway aligned with a chassis cooling gas passageway and a module cooling gas passageway. The sealing retainer includes a rigid retainer body having a retainer recess adjacent a first end to receive the module roller when the electronic module is in an inserted position. A retainer roller is received in a module recess and a compressible retainer body is between the rigid retainer body and the chassis.

16 Claims, 8 Drawing Sheets

(56) References Cited

U.S. PATENT DOCUMENTS

| | | | |
|---|---|---|---|
| 6,285,564 B1 | 9/2001 | OBrien | |
| 6,345,429 B1 * | 2/2002 | Jalanti | H05K 7/1418 403/353 |
| 6,425,706 B1 * | 7/2002 | Jalanti | G06F 1/184 29/760 |
| 6,687,130 B2 | 2/2004 | Adams, Sr. et al. | |
| 7,324,336 B2 | 1/2008 | Vos et al. | |
| 7,539,020 B2 * | 5/2009 | Chow | H05K 7/20781 361/759 |
| 7,599,184 B2 * | 10/2009 | Upadhya | H05K 7/20781 174/15.1 |
| 7,719,837 B2 * | 5/2010 | Wu | G06F 1/20 174/15.1 |
| 8,208,265 B2 | 6/2012 | Suzrez et al. | |
| 8,289,710 B2 * | 10/2012 | Spearing | H05K 7/20727 361/699 |
| 8,456,846 B2 | 6/2013 | Mosier et al. | |
| 8,743,544 B2 * | 6/2014 | Monson | H05K 7/1404 361/801 |
| 8,967,903 B1 | 3/2015 | Sharfi | |
| 9,426,931 B2 | 8/2016 | Kaplun et al. | |
| 9,839,116 B2 | 12/2017 | Kirk et al. | |
| 9,999,156 B2 | 6/2018 | Holahan et al. | |
| 11,019,753 B2 * | 5/2021 | James | G05D 23/2039 |
| 2002/0053122 A1 * | 5/2002 | Jalanti | G06F 1/185 29/428 |
| 2006/0133033 A1 | 6/2006 | Straub et al. | |
| 2007/0042514 A1 * | 2/2007 | Wu | H05K 7/20727 361/688 |
| 2007/0201204 A1 * | 8/2007 | Upadhya | H05K 7/20727 361/695 |
| 2007/0201210 A1 * | 8/2007 | Chow | H05K 7/20727 361/695 |
| 2009/0161312 A1 * | 6/2009 | Spearing | H05K 7/20781 361/679.53 |
| 2009/0225510 A1 | 9/2009 | Biemer et al. | |
| 2011/0176867 A1 | 7/2011 | Mosier et al. | |
| 2012/0087089 A1 * | 4/2012 | Monson | F16B 2/12 248/223.41 |
| 2014/0314514 A1 | 10/2014 | Paquette et al. | |
| 2016/0242322 A1 | 8/2016 | Wong et al. | |
| 2018/0376623 A1 * | 12/2018 | James | G06F 1/206 |
| 2019/0380225 A1 | 12/2019 | Thompson et al. | |
| 2020/0337175 A1 | 10/2020 | Krivonak et al. | |
| 2021/0410330 A1 | 12/2021 | Thompson et al. | |
| 2023/0354559 A1 | 11/2023 | Nguyen et al. | |

FOREIGN PATENT DOCUMENTS

| | | |
|---|---|---|
| EP | 2106205 B1 | 1/2017 |
| FR | 2981824 | 4/2013 |
| GB | 1508832 | 4/1978 |
| GB | 2496481 | 5/2013 |
| JP | H10256765 | 9/1998 |
| JP | 3264203 | 3/2002 |

* cited by examiner

ELECTRONIC ASSEMBLY HAVING SEALING RETAINER COUPLING AN ELECTRONIC MODULE AND ASSOCIATED METHOD

FIELD OF THE INVENTION

The present invention relates to the field of electronic assemblies, and, more particularly, to electronic assemblies having a chassis and electronic module with cooling gas passageways and related methods.

BACKGROUND OF THE INVENTION

As electronic packaging density and dissipated power increase to achieve higher levels of electronic performance, the need for efficient thermal transport within electronic assemblies having electronic modules carrying printed circuit boards also increases. Even though electronic components are becoming smaller with greater processing capability, and operate at a much lower power, these two advantages may have a counterintuitive effect of increasing thermal density because circuit designers are expected to pack even more functionality into ever smaller circuit spaces, thus increasing heat generation and requiring more advanced cooling and thermal management.

Brute force heat transfer techniques involve forced air, active liquid cooling, and similar heat transport mechanisms to transport heat from sensitive electronic components to heat sinks or similar heat spreading devices. Some heat transfer systems even use composite structures, for example, annealed pyrolytic graphite (APG) embedded within metallic skins or heat pipes connected to spreader plates.

A new industry standard, however, encourages the increased use of convection cooling to reduce dependence on conduction cooling using 3U and 6U circuit cards. The ANSI/VITA 48.8 mechanical form-factor standard leverages air-flow-through (AFT) cooling for chassis architectures to provide increased thermal performance while mitigating risk to electronic modules carrying different electronic components. The gas, i.e., normally air, is isolated to cooling paths adjacent the circuit board and the electronic components, where there are no foreign object debris (FOD), contaminants or impingements to the airflow.

The VITA 48.8 AFT standard is directed to channeling airflow through plug-in electronic modules and heat sinks that interface with a pressurized airflow manifold to reduce thermal resistances between the cooling medium and the heat-generating electronic components and provide a common framework for original equipment manufacturer (OEM) chassis and electronic module manufacturers. State-of-the-art designs that implement the VITA 48.8 AFT technology, however, may have technical drawbacks because of the complexity required in providing precision tapers on the plug-in electronic modules and the requirements for gaskets that interface components that cause binding. The gaskets may be compromised during insertion and extraction of the electronic modules, creating gas leaks and reducing heat transfer and cooling of electronic components.

SUMMARY OF THE INVENTION

In general, an electronic assembly may comprise a chassis having a plurality of electronic module mounting positions. Each electronic module mounting position may have a chassis cooling gas passageway. A respective electronic module may be received in each electronic module mounting position and may have a module cooling gas passageway. The electronic module may have a module recess adjacent a first end thereof and a module roller adjacent a second end thereof opposite the first end.

A respective sealing retainer may be coupled between the chassis and each electronic module. The sealing retainer may have a cooling gas passageway therethrough aligned with the chassis cooling gas passageway and the module cooling gas passageway. The sealing retainer may comprise a rigid retainer body having a retainer recess adjacent a first end thereof to receive the module roller when the electronic module is in an inserted position. A retainer roller may be carried by the rigid retainer body adjacent a second end thereof opposite the first end, and the retainer roller may be received in the module recess when the electronic module is in the inserted position. A compressible retainer body may be between the rigid retainer body and the chassis.

A respective sealing gasket may be carried by the rigid retainer body on a side thereof opposite the compressible retainer body. The module roller may comprise a module shaft and module tubular roller rotatably carried thereby. The retainer roller may comprise a retainer shaft and retainer tubular roller rotatably carried thereby. The chassis cooling gas passageway may comprise a chassis cooling gas inlet passageway. The chassis cooling gas passageway may comprise a chassis cooling gas outlet passageway.

In another example, at least one cooling gas manifold may be coupled to the chassis. The at least one cooling gas manifold may comprise an inlet cooling gas manifold and an outlet cooling gas manifold. Each electronic module may comprise a circuit board having a cooling gas path associated therewith, and an electrical connector carried by a first end of the circuit board.

Another aspect is directed to a method of mounting an electronic module in an electronic module mounting position of a chassis. The electronic module mounting position may have a chassis cooling gas passageway. The electronic module may have a module cooling gas passageway. A module recess may be adjacent a first end thereof, and a module roller may be adjacent a second end thereof opposite the first end. The method may comprise coupling a sealing retainer between the chassis and the electronic module. The sealing retainer may comprise a rigid retainer body having a retainer recess adjacent a first end thereof to receive the module roller when the electronic module is in an inserted position. The rigid retainer body may have a first cooling gas passageway to be aligned with the module cooling gas passageway. A retainer roller may be carried by the rigid retainer body adjacent a second end thereof opposite the first end, the retainer roller received in the module recess when the electronic module is in the inserted position. A compressible retainer body may be between the rigid retainer body and the chassis and may have a second cooling gas passageway to be aligned with the chassis cooling gas passageway.

BRIEF DESCRIPTION OF THE DRAWINGS

Other objects, features and advantages of the present invention will become apparent from the detailed description of the invention which follows, when considered in light of the accompanying drawings in which.

DETAILED DESCRIPTION

The present description is made with reference to the accompanying drawings, in which exemplary embodiments are shown. However, many different embodiments may be used, and thus, the description should not be construed as limited to the particular embodiments set forth herein. Rather, these embodiments are provided so that this disclosure will be thorough and complete. Like numbers refer to like elements throughout.

Figure 1:
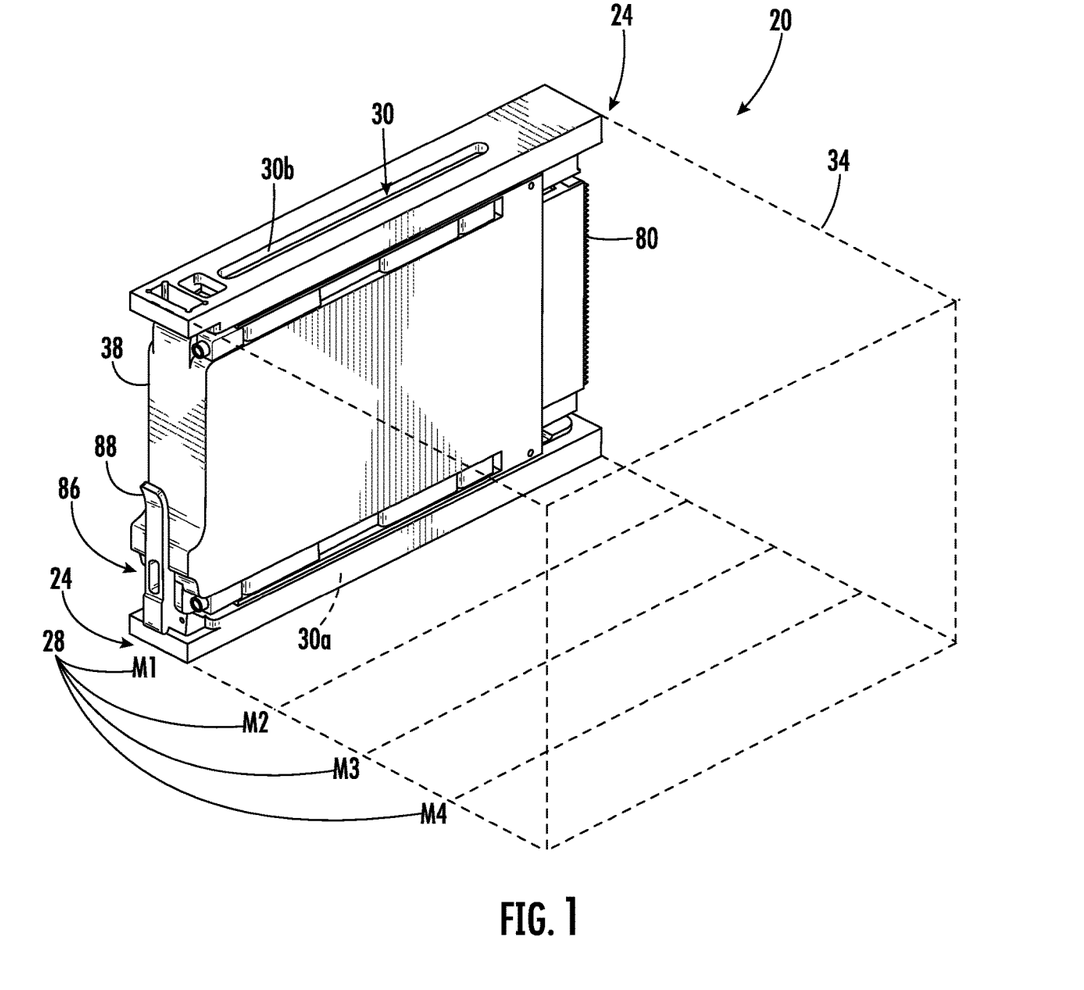
FIG. 1 is an isometric view of the electronic assembly showing a sealing retainer coupled between the chassis and electronic module in accordance with an example embodiment.
Figure 2:
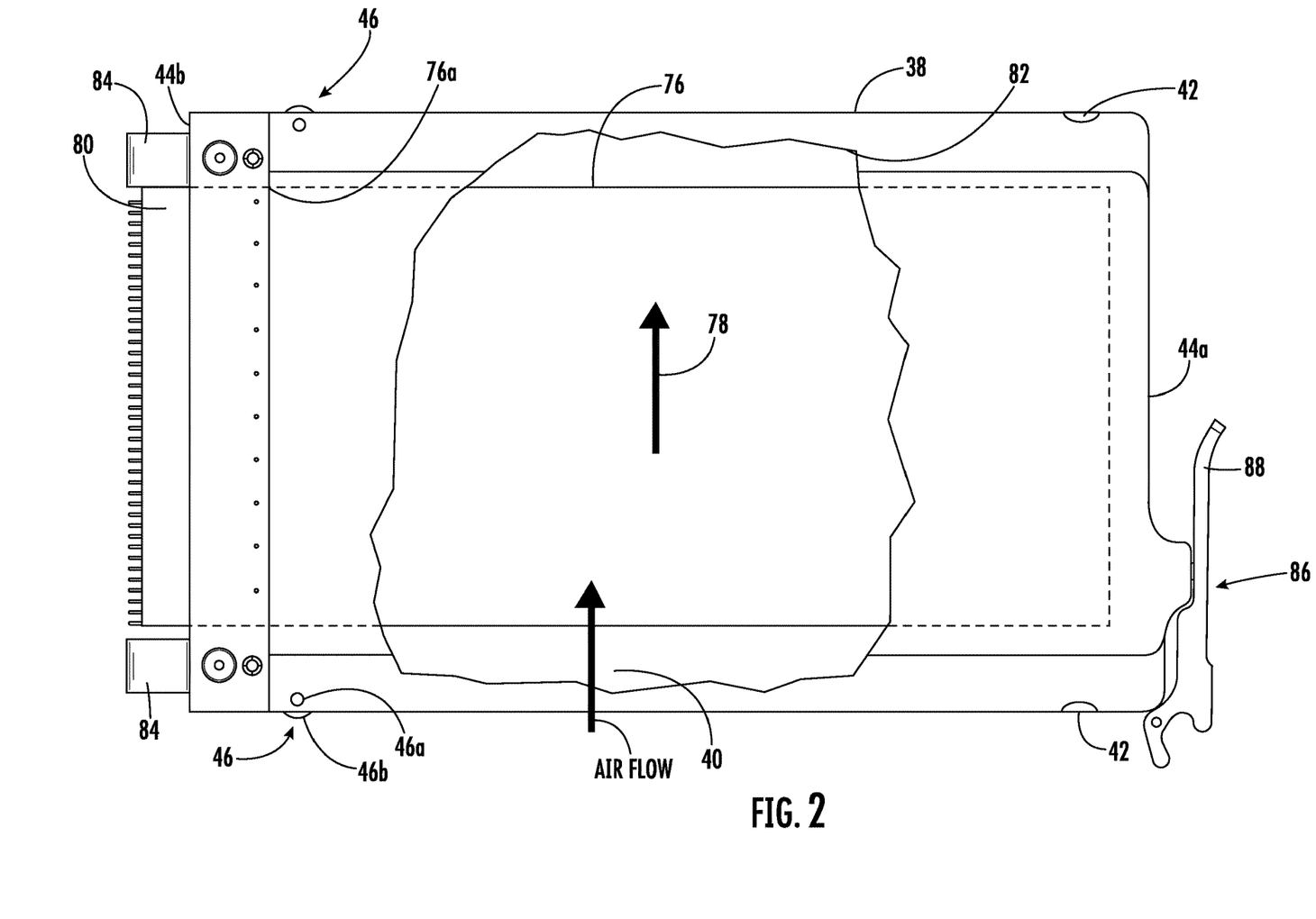
FIG. 2 is a side elevation view of the electronic module of FIG. 1 showing the module recess and module roller.
Figure 3:
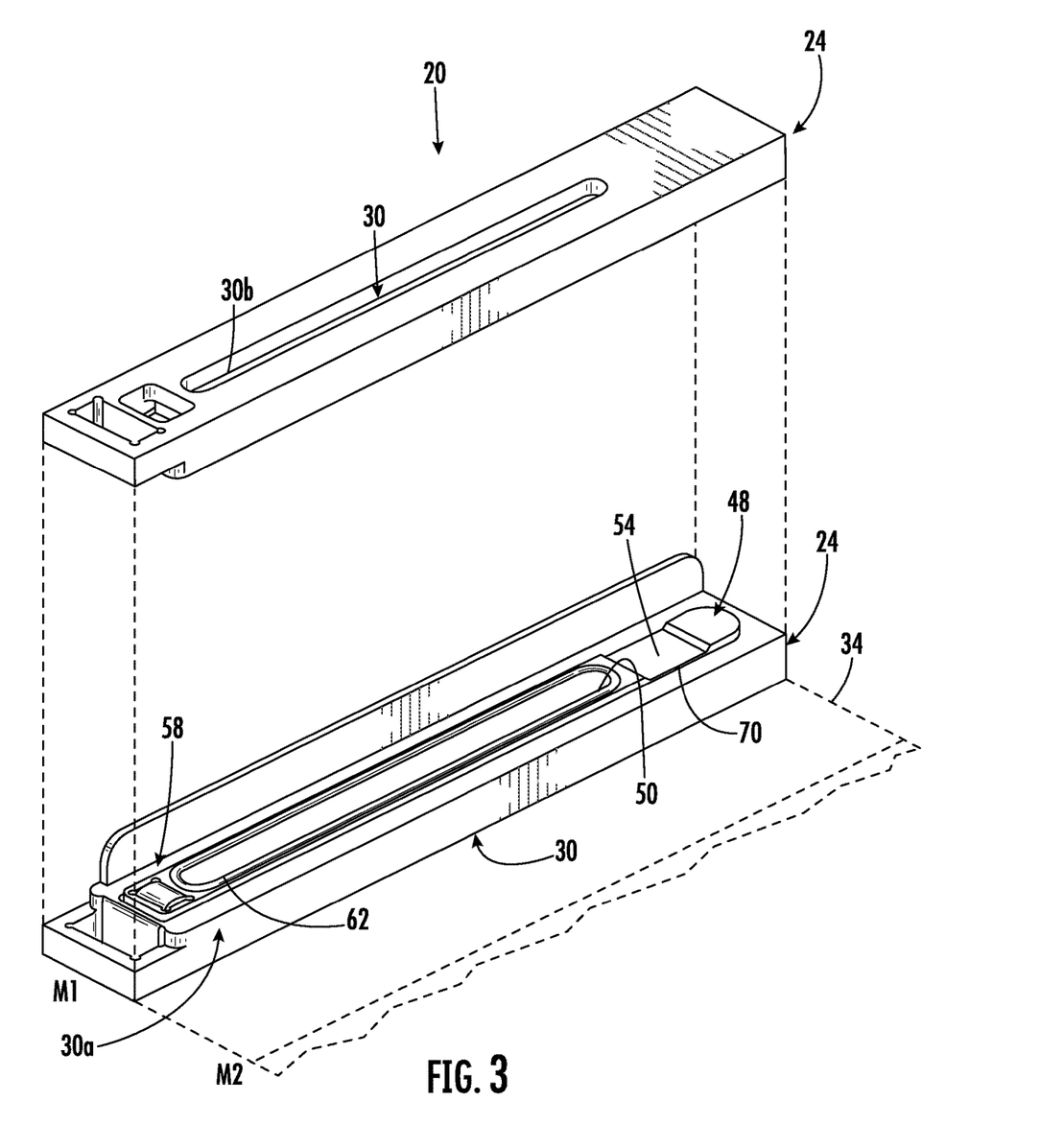
FIG. 3 is an exploded isometric and partial schematic view of sealing retainers coupled to the chassis.
Figure 4:
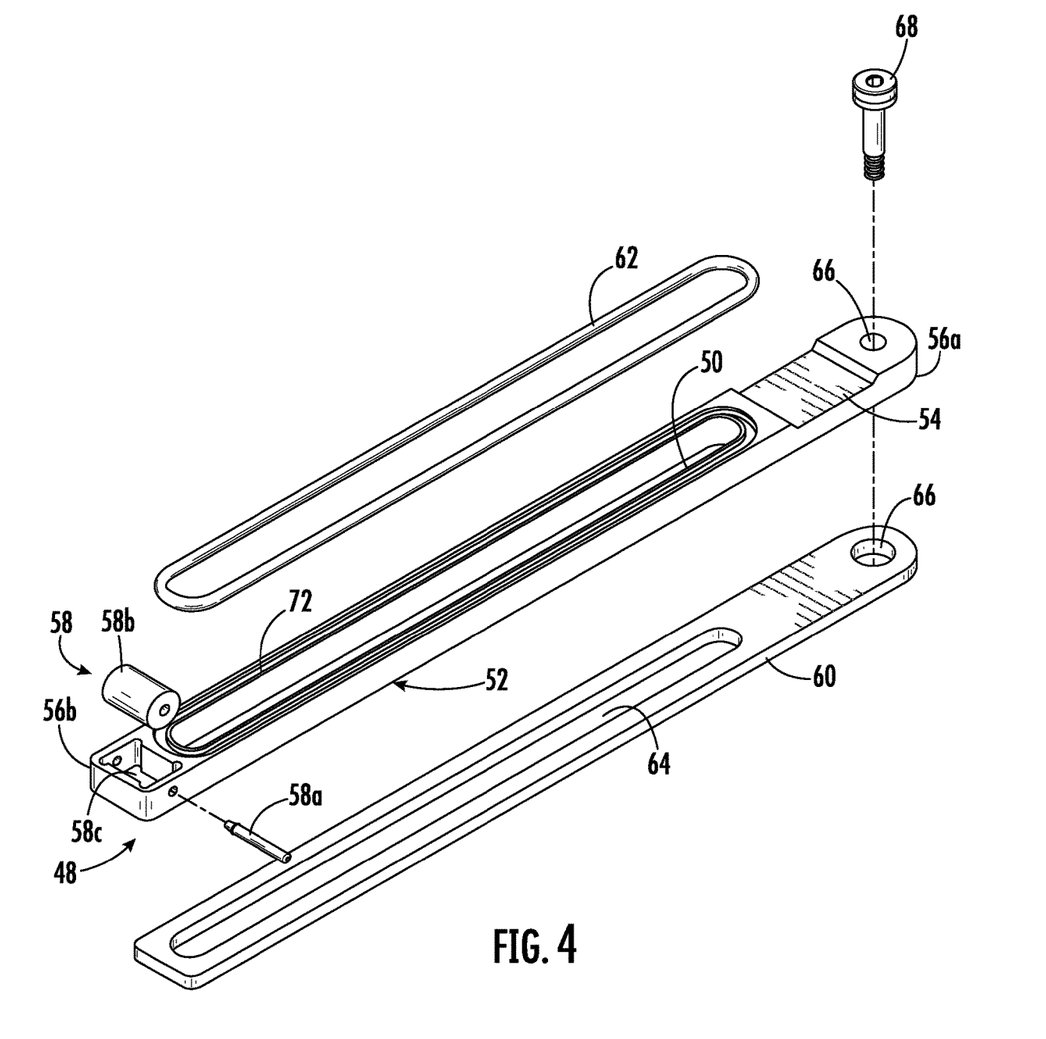
FIG. 4 is an exploded isometric view of the sealing retainer.
Figure 5:
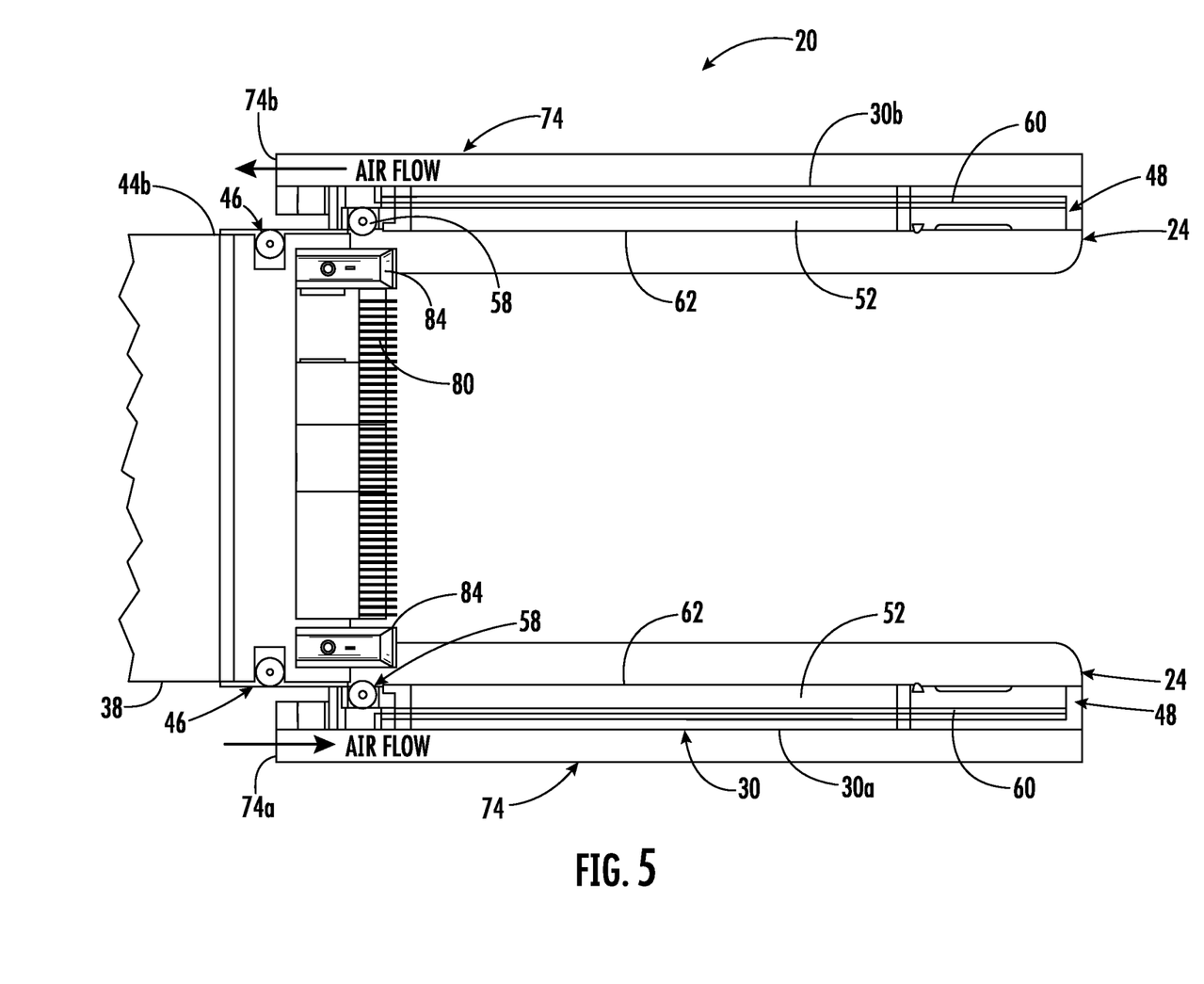
FIG. 5 is a side sectional view of the electronic module as it enters the chassis and showing schematically the inlet and outlet cooling gas manifold coupled to the chassis.
Figure 6:
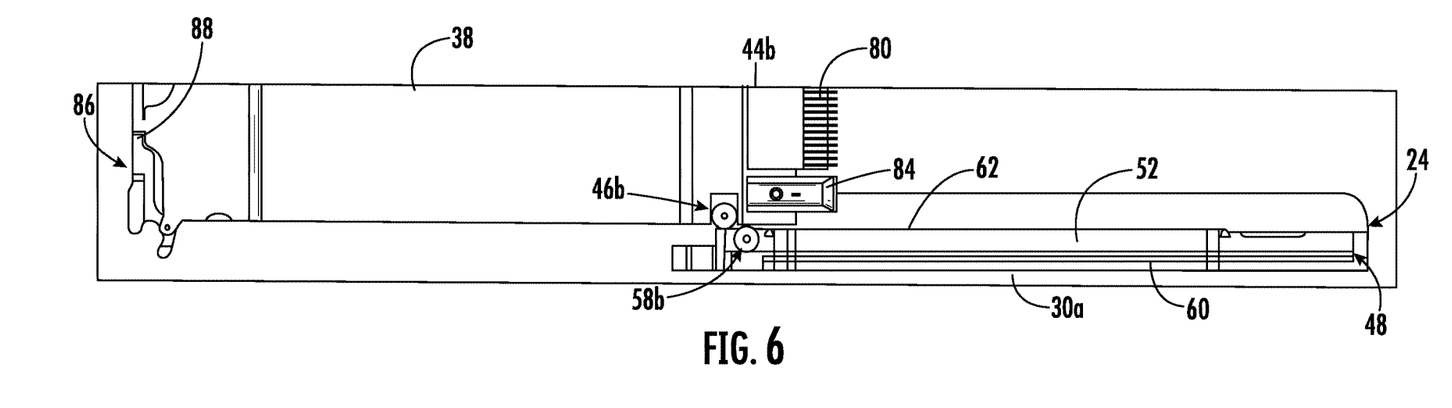
FIG. 6 is a side sectional view of the sealing retainer and lower section of the electronic module when initially inserted within the chassis.

Referring initially to FIGS. 1-5, an electronic assembly is shown generally at 20 and includes a chassis 24 having a plurality of electronic module mounting positions 28, which in the example of FIG. 1 are represented by four electronic module mounting positions numbered M1 to M4. Each electronic module mounting position 28 has a chassis cooling gas passageway 30 with a chassis cooling gas inlet passageway 30a and chassis cooling gas outlet passageway 30b, as best shown in FIGS. 3 and 5, where upper and lower sections of the classis 24 at the first mounting position 28 corresponding to M1 are shown. The electronic assembly 20 illustrated in FIG. 1 does not show in detail its side walls, top and bottom for the chassis 24, and instead, portions of the side walls, and the top and bottom of the chassis are outlined by the dashed lines at 34 for purposes of illustrating the configuration of the electronic assembly. The different electronic module mounting positions 28 are numbered M1-M4 with the electronic module mounting position M1 including an electronic module 38 received in that position and the electronic module mounting positions M2-M4 shown schematically.

Each electronic module 38 has a module cooling gas passageway 40 (FIG. 2) and a module recess 42 adjacent a first end 44a thereof and a module roller 46 adjacent a second end 44b thereof opposite the first end. A respective sealing retainer 48 is coupled between the chassis 24 and each electronic module 38 as best shown in FIG. 5. Each sealing retainer 48 has a cooling gas passageway 50 therethrough (FIG. 4) aligned with the chassis cooling gas passageway 30 and the module cooling gas passageway 40 as shown in FIG. 9 when the electronic module 38 is fully inserted in the chassis 24.

Figure 9:
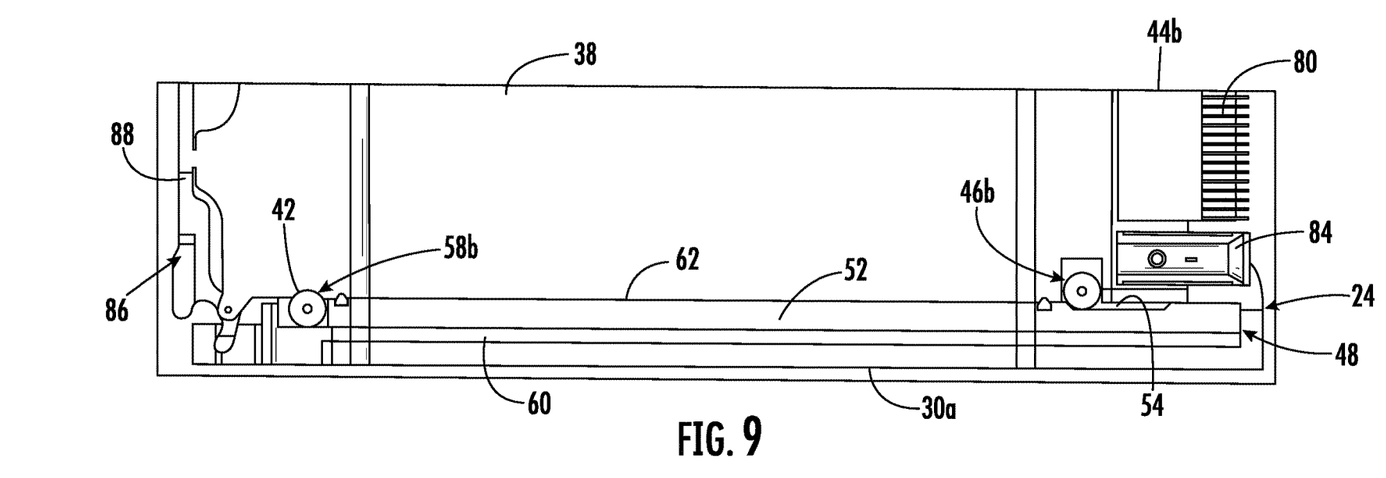
FIG. 9 is a side sectional view of the sealing retainer and lower section of the electronic module when it is fully inserted in the classis and the module roller is received in the module recess of the sealing retainer.

As best shown in the exploded isometric view of FIG. 4, the sealing retainer 48 includes a rigid retainer body 52 having a retainer recess 54 adjacent a first end 56a thereof to receive the module roller 46 when the electronic module 38 is in the fully inserted position (FIG. 9). A retainer roller 58 is carried by the rigid retainer body 52 adjacent a second end 56b thereof opposite the first end 56a. The retainer roller 58 is received in the module recess 42 of the electronic module 38 when the electronic module is in the fully inserted position. A compressible retainer body 60 is positioned between the rigid retainer body 52 and the chassis 24 (FIGS. 5-9).

A respective sealing gasket 62 is carried by the rigid retainer body 52 on a side opposite the compressible retainer body 60 (FIG. 4). In this example, the sealing gasket 62 may be formed from a polymeric, elastic material and configured as a longitudinally extending O-ring. The compressible retainer body 60 may be formed from a compressible thermal insulating material (TIM) and positioned between the rigid retainer body 52 and the chassis 24. The compressible retainer body 60 is configured similar to the rigid retainer body 52 and fits underneath on the lower side of the rigid retainer body, such that the rigid retainer body compresses the compressible retainer body as the electronic module 38 is inserted into the chassis 24 and rolls over the top of the rigid retainer body.

The compressible retainer body 60 includes a longitudinally configured oval opening 64 (FIG. 4) corresponding to the retainer cooling gas passageway 50 formed in the rigid retainer body 52. Both the rigid retainer body 52 and compressible retainer body 60 include a mounting hole 66 to receive a fastener 68, such as a screw or other nut, which retains the sealing retainer 48 onto the chassis 24. In the example shown in FIG. 3, the sealing retainer 48 is retained within an oval opening 70 at each upper and lower section of the chassis 24 that receives the respective sealing retainer. The sealing gasket 62 configured as an O-ring in this example is received within an O-ring receiving channel 72 formed on the top surface of the rigid retainer body 52 (FIG. 4).

As best shown in FIGS. 2, 4 and 5, the module roller 46 includes a module shaft 46a and module tubular roller 46b rotatably carried thereby. The retainer roller 58 includes a retainer shaft 58a and retainer tubular roller 58b rotatably carried by the shaft (FIG. 4). The retainer tubular roller 58b is received within a roller cut-out 58c formed in the rigid retainer body 52, and configured to allow only the top section of the retainer tubular roller to extend above the top surface of the rigid retainer body.

The chassis cooling gas passageway 30 as noted before includes a chassis cooling gas inlet passageway 30a and a chassis cooling gas outlet passageway 30b as shown in the exploded view of FIG. 3, showing upper and lower sections of a segment of the chassis 24, each section receiving a sealing retainer 48 corresponding to the first electronic mounting position 28 as M1 in FIG. 1. As shown in the sectional view of the chassis 24 in FIG. 5, at least one cooling gas manifold 74 is coupled to the chassis. The cooling gas manifold 74 in this example includes an inlet cooling gas manifold 74a and an outlet cooling gas manifold 74b so that gas such as air is forced from the inlet cooling gas manifold 74a through the lower section of the chassis 24 and its sealing retainer 48 into the electronic module 38. Cooling gas then passes out through the electronic module 38 into the sealing retainer 48 at the upper section of the chassis 24 and its chassis cooling gas outlet passageway 30b, and from there, the gas passes outward from the electronic assembly 20 via the outlet cooling gas manifold 74b.

Each electronic module 38 includes a circuit board 76 having a cooling gas path 78 associated therewith, and an electrical connector 80 carried by a first end 76a of the circuit board as shown in FIG. 2, which also shows a cut-out 82 formed in the electronic module and the circuit board adjacent the cooling gas path 78 and the module cooling gas passageway 40. Any electronic components mounted on the circuit board 76 are cooled by the direct gas (air) flow adjacent to a metal or other support to which the circuit board is coupled. The electrical connector 80 carried by the first end of the circuit board may be formed as an electrical back plane connector.

In the illustrated embodiment, opposing sides of the electronic module 38 are parallel rather than tapered overcoming the disadvantages of some electronic modules that are designed with a taper to meet the VITA 48.8 AFT standard. The second end 44b of the electronic module 38 adjacent the electrical connector 80 of the circuit board 76 includes upper and lower module guides 84 shaped like posts to facilitate and guide the electronic module into a clean connection with a female connector (not shown) on the chassis 24 when the electronic module is fully inserted within the chassis. The module guides 84 are illustrated schematically in the sectional drawings of FIGS. 6-9 as tubular configured module guides.

Figure 7:
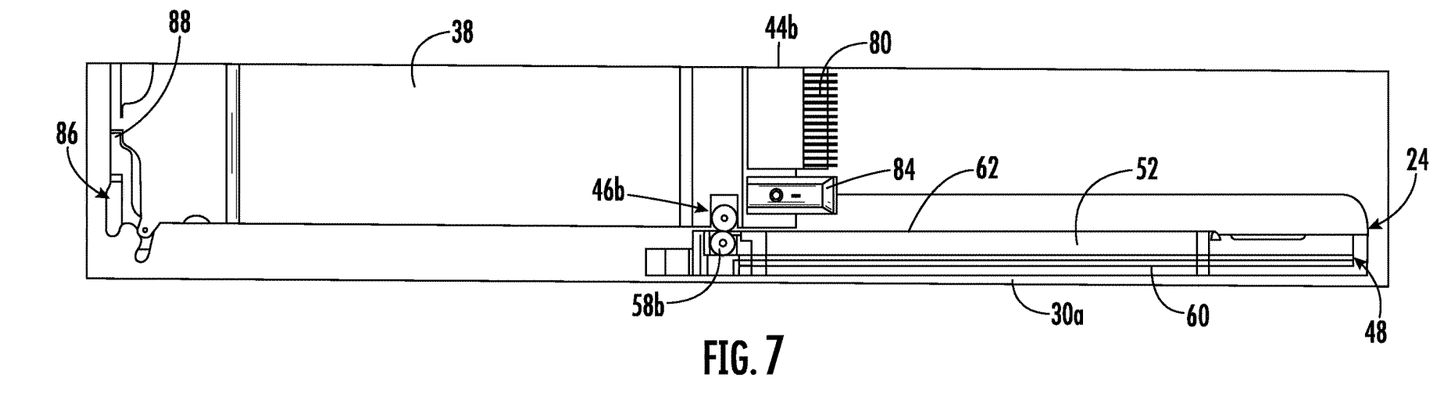
FIG. 7 is a side sectional view of the sealing retainer and lower section of the electronic module when partially inserted in the chassis and the module roller and retainer roller engage each other.
Figure 8:
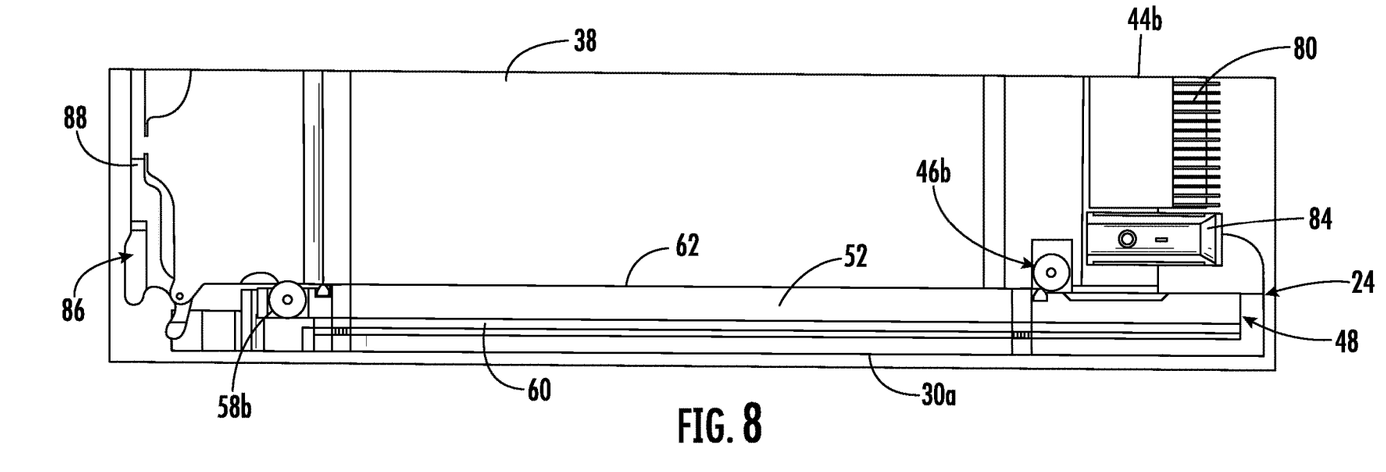
FIG. 8 is a side sectional view of the sealing retainer and lower section of the electronic module when it is almost fully inserted in the chassis.

As shown in FIGS. 6-9, a sequence for inserting the electronic module 38 within the chassis 24 is illustrated. The electronic module 38 is initially inserted within the chassis 24 (FIG. 6), and as shown in FIG. 7, the module tubular roller 46b and retainer tubular roller 58b engage each other. The electronic module 38 is further inserted (FIG. 8) and the module tubular roller 46b rolls over the top section of the rigid retainer body 52 and exerts minimal force against the respective sealing gasket 62 carried by the rigid retainer body. At this time, the compressible retainer body 60 is compressed between the rigid retainer body 52 and the chassis 24 as the electronic module 38 is inserted by the downward force of the module tubular roller 46b exerted against the rigid retainer body 52. After the electronic module 38 is fully inserted (FIG. 9), the module tubular roller 46b is received within the retainer recess 54, and the module recess 42 adjacent the first end of the electronic module 38 is received over the retainer tubular roller 58b carried by the rigid retainer body 52.

The electronic module 38 may be locked in this fully inserted position by a locking mechanism 86 located at the first end 44a of the electronic module, such as the finger clamp as shown in FIG. 2. In this example, a pivoting finger grip 88 on the finger clamp 86 may be pressed forward and the electronic module 38 lifted at that first end 44a and the electronic module removed from the chassis 24 in the reverse process as when inserting the electronic module 38. The compressible retainer body 60 is compressed as the electronic module 38 is slid rearward from the chassis 24. The combination and use of the module roller 46 and retainer roller 58 during insertion and removal of the electronic module 38 helps eliminate friction between these components and the sealing retainer 48 to maintain an adequate gas seal even after numerous cycles of insertion and removal. The configuration of the rigid retainer body 52 with its retainer roller 58, compressible retainer body 60 and sealing gasket 62 also saves weight and provides high reliability gas flow without leakage and permits a secondary cooling connection between the electronic module 38 and the chassis 24.

The electronic assembly 20 incorporates the chassis 24 and sealing retainer 48 for air-flow-through (AFT), cooled plug-in electronic modules 38 in both the 3U and 6U form factor, for example. Cooling capabilities may be increased because the gas flow may be confined to the electronic module 38 near the circuit board 76 and its cooling gas path 78 associated therewith.

It is also possible to provide for heat conduction into a wall of the chassis 24 using a thermally conductive material positioned at the top of the electronic module 38. The electronic assembly 20 incorporating the sealing retainer 48 provides an efficient design without the necessity for a taper on the electronic module, such as required with other state-of-the-art VITA 48.8 AFT compliant designs. The only gasket compression occurs when the compressible retainer body 60 between the rigid retainer body 52 and the chassis 24 is compressed upon insertion or removal of the electronic module 38. There are no moving parts that exert sliding forces against that compressible retainer body 52 during insertion or removal of the electronic module 38 from the chassis 24. The module roller 46 passes over the top surface of the rigid retainer body 52 without damaging the electronic module 38 or damaging the compressible retainer body 60 and the respective sealing gasket 62 carried by the rigid retainer body 52 on a side opposite the compressible retainer body, thus ensuring an adequate gas seal after repeated cycles of insertion and removal of the electronic module.

Figure 10:
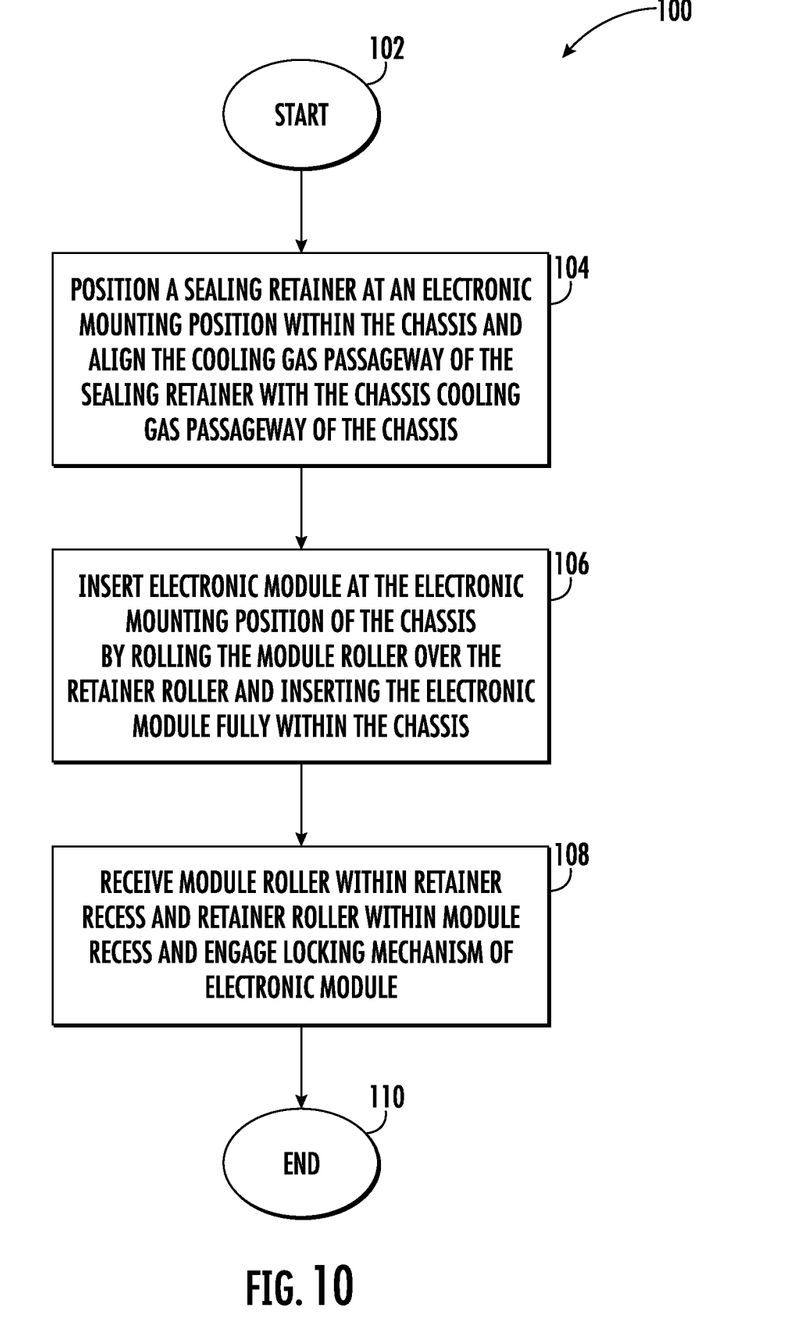
FIG. 10 is a high-level flowchart showing a method of mounting an electronic module in an electronic module mounting position of the chassis.

Referring now to FIG. 10, there is illustrated a high-level flowchart of a method of mounting an electronic module 38 in an electronic module mounting position 28 of the chassis 24, which method is illustrated generally at 100. The process starts (Block 102) and the sealing retainer 48 is positioned at an electronic mounting position 28 within the chassis 24, ensuring that the retainer cooling gas passageway 50 of the sealing retainer is aligned with the chassis cooling gas passageway 30 in the chassis (Block 104). An electronic module 38 is inserted within the chassis 24 such that the module roller 46 initially passes over the retainer roller 58 and compresses the compressible retainer body 60 between the rigid retainer body 52 and the chassis (Block 106). As the electronic module 38 is rolled into the chassis 24, the compressible retainer body 60 stays compressed until the electronic module is fully inserted in the chassis. At this fully inserted position, the module roller 46 is received within the retainer recess 54 of the rigid retainer body 52 and the retainer roller 58 engages the module recess 42 (Block 108). The process ends (Block 110).

This method is advantageous as described because as the electronic module 38 is inserted within the chassis 24, the compressible retainer body 60 is compressed and the only wear interface is on the module roller 46 and retainer roller 58. When fully inserted, the locking mechanism such as the finger clamp 86 or other fastener secures the electronic module 38 within the chassis 24.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

The invention claimed is:

1. An electronic assembly comprising:
a chassis having a plurality of electronic module mounting positions, each electronic module mounting position having a chassis cooling gas passageway;
a respective electronic module received in each electronic module mounting position and having a module cooling gas passageway, the electronic module having a module recess adjacent a first end thereof and a module roller adjacent a second end thereof opposite the first end; and
a respective sealing retainer coupled between the chassis and each electronic module, the sealing retainer having a cooling gas passageway therethrough aligned with the chassis cooling gas passageway and the module cooling gas passageway, the sealing retainer comprising
a rigid retainer body having a top surface and opposing lower surface, and a retainer recess formed on the top surface adjacent a first end thereof to receive the module roller when the electronic module is in an inserted position,
a roller cutout formed within the top surface of the rigid retainer body adjacent a second end thereof opposite the first end, a retainer roller carried within the roller cutout and configured such that a top section of the retainer roller extends above the top surface, said retainer roller received in the module recess when the electronic module is in the inserted position,
a compressible retainer body between the lower surface of the rigid retainer body and the chassis; and
a sealing gasket carried by the rigid retainer body on the top surface.

2. The electronic assembly of claim 1 wherein the module roller comprises a module shaft and module tubular roller rotatably carried thereby.

3. The electronic assembly of claim 1 wherein the retainer roller comprises a retainer shaft and retainer tubular roller rotatably carried thereby.

4. The electronic assembly of claim 1 wherein the chassis cooling gas passageway comprises a chassis cooling gas inlet passageway.

5. The electronic assembly of claim 1 wherein the chassis cooling gas passageway comprises a chassis cooling gas outlet passageway.

6. The electronic assembly of claim 1 comprising at least one cooling gas manifold coupled to the chassis.

7. The electronic assembly of claim 6 wherein the at least one cooling gas manifold comprises an inlet cooling gas manifold and an outlet cooling gas manifold.

8. The electronic assembly of claim 1 wherein each electronic module comprises a circuit board having a cooling gas path associated therewith, and an electrical connector carried by a first end of the circuit board.

9. A sealing retainer to be coupled between a chassis and an electronic module, the chassis having a plurality of electronic module mounting positions and each electronic module mounting position having a chassis cooling gas passageway, the electronic module having a module cooling gas passageway, a module recess adjacent a first end thereof, and a module roller adjacent a second end thereof opposite the first end, the sealing retainer comprising:
a rigid retainer body having a top surface and opposing lower surface, and a retainer recess formed on the top surface adjacent a first end thereof to receive the module roller when the electronic module is in an inserted position, the rigid retainer body having a first cooling gas passageway to be aligned with the module cooling gas passageway;
a roller cutout formed within the top surface of the rigid retainer body adjacent a second end thereof opposite the first end, a retainer roller carried within the roller cutout and configured such that a top section of the retainer roller extends above the top surface, said retainer roller received in the module recess when the electronic module is in the inserted position;
a compressible retainer body between the lower surface of the rigid retainer body and the chassis and having a second cooling gas passageway to be aligned with the chassis cooling gas passageway; and
a sealing gasket carried by the rigid retainer body on a side thereof opposite the compressible retainer body.

10. The sealing retainer of claim 9 wherein the module roller comprises a module shaft and module tubular roller rotatably carried thereby.

11. The sealing retainer of claim 9 wherein the retainer roller comprises a retainer shaft and retainer tubular roller rotatably carried thereby.

12. The sealing retainer of claim 9 wherein the electronic module comprises a circuit board having a cooling gas path associated therewith, and an electrical connector carried by a first end of the circuit board.

13. A method of mounting an electronic module in an electronic module mounting position of a chassis, the electronic module mounting position having a chassis cooling gas passageway, and the electronic module having a module cooling gas passageway, a module recess adjacent a first end thereof, and a module roller adjacent a second end thereof opposite the first end, the method comprising:
coupling a sealing retainer between the chassis and the electronic module, the sealing retainer comprising
a rigid retainer body having a top surface and opposing lower surface, and a retainer recess formed on the top surface adjacent a first end thereof to receive the module roller when the electronic module is in an inserted position, the rigid retainer body having a first cooling gas passageway to be aligned with the module cooling gas passageway,
a roller cutout formed within the top surface of the rigid retainer body adjacent a second end thereof opposite the first end, a retainer roller carried within the roller cutout and configured such that a top section of the retainer roller extends above the top surface, said retainer roller received in the module recess when the electronic module is in the inserted position,
a compressible retainer body between the lower surface of the rigid retainer body and the chassis and having a second cooling gas passageway to be aligned with the chassis cooling gas passageway; and
a sealing gasket carried by the rigid retainer body on the top surface.

14. The method of claim 13 wherein the module roller comprises a module shaft and module tubular roller rotatably carried thereby.

15. The method of claim 13 wherein the retainer roller comprises a retainer shaft and retainer tubular roller rotatably carried thereby.

16. The method of claim 13 wherein the electronic module comprises a circuit board having a cooling gas path associated therewith, and an electrical connector carried by a first end of the circuit board.

* * * * *